US006052002A

United States Patent [19]
Kinge

[11] Patent Number: 6,052,002

[45] Date of Patent: Apr. 18, 2000

[54] IGNITION SYSTEMS HAVING A SERIES CONNECTION OF A SWITCH/INDUCTOR AND A CAPACITOR

[75] Inventor: Richard Arthur George Kinge, Bishops Tachbrook, United Kingdom

[73] Assignee: Smiths Industries Public Limited Company, London, United Kingdom

[21] Appl. No.: 09/081,131

[22] Filed: May 19, 1998

[30] Foreign Application Priority Data

Jun. 12, 1997 [GB] United Kingdom .................. 9712110

[51] Int. Cl.$^7$ .................................................. H03B 1/00

[52] U.S. Cl. .................... 327/110; 123/406.57; 123/604; 123/605

[58] Field of Search .................................. 327/110, 190; 123/406.57, 600, 604, 605, 620, 596, 599

[56] References Cited

U.S. PATENT DOCUMENTS

| | | | |
|---|---|---|---|
| 4,441,479 | 4/1984 | Endo et al. | 123/605 |
| 4,479,467 | 10/1984 | Burrows et al. | 123/606 |
| 4,576,138 | 3/1986 | Wolf | 123/600 |
| 5,025,498 | 6/1991 | Agren | 361/156 |
| 5,513,618 | 5/1996 | Rich et al. | 123/598 |
| 5,736,884 | 4/1998 | Ettes et al. | 327/190 |

FOREIGN PATENT DOCUMENTS

| | | |
|---|---|---|
| 0371930 | 6/1990 | European Pat. Off. . |
| 1452122 | 10/1976 | United Kingdom . |

*Primary Examiner*—Jung Ho Kim
*Attorney, Agent, or Firm*—Pollock, Vande Sande & Amernick

[57] ABSTRACT

An ignition system has several charging circuits connected to a common input circuit and controlled by a common triggering unit to fire respective igniters. The input circuit has a voltage source connected across a first capacitor, which provides the output terminals of the source. Each charging circuit has a second capacitor connected in series with one end of an inductance. A tapping of the inductance is connected to an input of the charging circuit via a diode and a thyristor, controlled by the triggering unit. The output of the charging circuit is provided by one electrode of the second capacitor and the opposite end of the inductance.

8 Claims, 1 Drawing Sheet

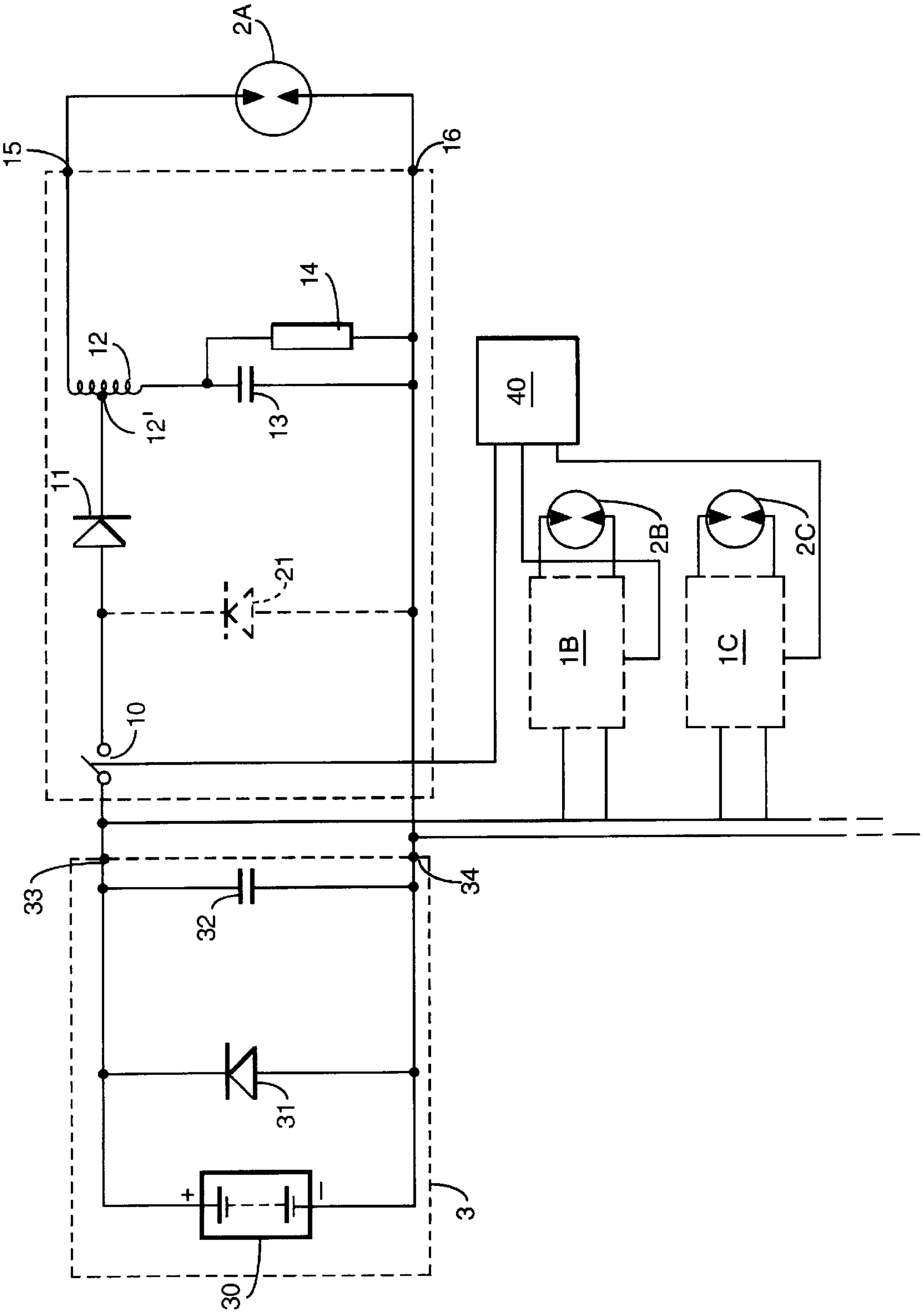
2A
15
16
14
12
12'
13
11
21
10
40
2B
2C
1B
1C
33
34
32
31
+
3
30

IGNITION SYSTEMS HAVING A SERIES CONNECTION OF A SWITCH/INDUCTOR AND A CAPACITOR

BACKGROUND OF THE INVENTION

This invention relates to ignition systems and methods.

High energy ignition systems are usually of the capacitor discharge kind where electrical energy is stored in a capacitor and is then rapidly discharged to an igniter or spark plug, producing an intense spark sufficient to ignite a fuel-air mixture. A solid state igniter may require a voltage of up to about 2000 volts to ensure reliable ignition in a gas-fuelled or oil-fuelled turbine. Once the flash has occurred, the voltage collapses to near zero while a large current flows, commonly in excess of 1500 amps, for the duration of the spark, until the energy stored in the capacitor has been dissipated. Various different arrangements are used to perform the switching operation by which the charged capacitor is connected to the igniter. For example, gas discharge tubes can be used, but these are bulky, expensive and can be delicate. Solid state switches, such as thyristors, have various advantages in that they are robust, compact and easily controlled. One problem with solid state switches is that those capable of handling very high voltages and currents are very expensive.

SUMMARY OF THE INVENTION

It is an object of the present invention to provide an improved ignition system.

According to one aspect of the present invention there is provided an ignition circuit including a first capacitor, a voltage source connected across the first capacitor, a series connection of switching means, an inductance and a second capacitor connected across the first capacitor, an ignition output is connected to receive the charge on the second capacitor, so that when the switching means is closed, energy stored in said first capacitor is transferred to the second capacitor via the inductance, which acts to increase the voltage applied to the second capacitor and to the output.

The circuit may include a unidirectional current device connected across the first capacitor in a reversed biased sense. The switching means is preferably a solid-state switch such as a thyristor. The second capacitor is preferably connected to one end of the inductance, the ignition output being connected across a series connection of the second capacitor and the inductance, and the energy stored on the first capacitor being supplied to a tapping of the inductance between its ends. The series connection preferably includes a unidirectional current device. The circuit may include a resistor connected in parallel across the second capacitor.

According to another aspect of the present invention there is provided an ignition system including an input circuit including a first capacitor and a voltage source connected across the first capacitor; a plurality of charging circuits connected with the input circuit, wherein each charging circuit includes a series connection of switching means, an inductance and a second capacitor connected across the first capacitor. An ignition output is connected to receive the charge on the second capacitor, so that when the switching means is closed, energy stored in the first capacitor is transferred to the second capacitor via the inductance, which acts to increase the voltage applied to the second capacitor and to the output; a triggering unit is connected with the switching means of each charging circuit.

According to a further aspect of the present invention there is provided a method of producing ignition including storing electrical energy in a first device, transferring a part of the energy stored in the first device to a second device via means to increase the voltage above a level for discharge and subsequently transferring energy remaining in the first device to the discharge.

According to yet another aspect of the invention there is provided an arrangement for performing a method according to the above further aspect of the invention.

BRIEF DESCRIPTION OF THE DRAWING

An ignition system and method according to the present invention will now be described, by way of example, with reference to the accompanying drawing.

The drawing is a circuit diagram of the system.

DETAILED DESCRIPTION OF THE PREFERRED EMBODIMENT

The system includes several charging circuits, only three of which 1A, 1B and 1C are shown, connected to respective high energy, solid state discharge igniters 2A, 2B and 2C. All the charging circuits 1A to 1C are connected to a common input circuit 3.

The input circuit 3 includes a current-limited voltage source 30 connected across a parallel arrangement of a diode 31 and a main storage capacitor 32. The cathode of the diode 31 is connected to the positive output of the source 30, so that it is reverse biased. The voltage source 30 is of the kind that will safely withstand momentary short circuits applied to its output. The output terminals 33 and 34 of the input circuit are taken across the capacitor 32.

Each charging circuit 1A to 1C is identical, so only the circuit 1A will be described here. The circuit 1A has switching means 10 in the form of a thyristor or a similar solid state switch connected, at one terminal, to the positive output terminal 33 of the input circuit 3. The other terminal of the thyristor 10 is connected to the anode of a power diode 11, the cathode of which is connected to a tapping 12' between opposite ends of an inductor 12, such as an air-cored coil or other device with inductance capable of maintaining its inductance while passing a large discharge current. One end terminal of the inductor 12 is connected to one electrode of a second, supplementary capacitor 13; the diode 11, inductor 12 and capacitor 13 together form a series resonant circuit. The second capacitor 13 has a smaller capacity than the first capacitor 32 and has a power resistor 14 connected in parallel with it. The other electrode of the capacitor 13 is connected to the other input of the charging circuit 1A, which is, in turn connected to the negative terminal 34 of the input circuit 3. The other end terminal of the inductor 12 is connected to one output terminal 15 of the charging circuit; the other output terminal 16 is connected to the other, negative electrode of the capacitor 13. In this way, the output terminals 15 and 16 of the charging circuit 1A are taken across a series connection of the capacitor 13 and the inductor 12, these terminals being connected across the igniter 2A.

The gate electrode of the thyristor switch 10 in each charging circuit 1A to 1C is connected to a triggering unit 40. This triggering unit 40 controls closing of the thyristors in each circuit 1A to 1C, so that the igniters 2A to 2C are fired in the desired sequence.

In operation, the switch 10 is assumed initially to be open and the capacitors 32 and 13 to be discharged. Current flows from the source 30 to charge the main storage capacitor 32. The triggering circuit 40 leaves the switch 10 open for sufficient time to allow the capacitor 32 to charge fully. When the triggering circuit 40 closes the switch 10, the charge on the capacitor 32 is connected to the series resonant circuit of the diode 11, a part of the inductor 12 and capacitor 13. At the instant of closure of the switch 10, the capacitor 13 is discharged and so the full voltage of the capacitor 32 appears across a part of the inductor coil 12. By transformer action, this voltage is instantaneously stepped up at the other end of the winding for application to the igniter 2A. The rate of change of current is controlled and limited by the inductance 12, thereby protecting the thyristor 10 from excessively high peak values. As the current increases, energy is stored in the inductor 12 until the voltage on the supplementary capacitor 13 equals that on the main capacitor 32. When this level is reached, there is no further increase in current through the inductor 12. At this time, the voltage across the inductor 12 has fallen to zero and so the initial high voltage spike on the igniter 2A ends. The inductor 12 now acts to maintain the established current flow in the way well known in series resonant circuits. The energy stored in its inductance is transferred into the supplementary capacitor 13, further increasing its voltage to a level that can be almost twice that of the main capacitor 32 and to a level that exceeds the firing voltage of the igniter 2A. In this way, the igniter 2A is subjected to an initial very high voltage spike of short duration, followed by a sustained high voltage until discharge occurs. The diode 11 prevents the high voltage produced on the supplementary capacitor 13 discharging back to the main capacitor 32. The diode 11 also limits the reverse voltage seen by the switching device 10, which can be important because some thyristors are asymmetric and cannot withstand reverse voltages. Because the discharge energy in the present arrangement is derived from a relatively low voltage store, it tends to prolong the discharge giving a greater effect on lighting the fuel. The circuit could include an optional additional diode 21 having its cathode connected between the switching device 10 and the diode 11, and with its anode connected to the output terminal 16.

When the igniter 2A fires and the supplementary capacitor 13 is discharged, a large current flows directly from this capacitor to the igniter. When the voltage on the supplementary capacitor 13 has fallen towards zero, the main discharge current from the main capacitor 32 then flows to the igniter 2A. The rate of change of this current is controlled by the inductor 12 to prevent destructive levels being reached in the thyristor 10. The diode 31 in the input circuit 3 prevents reverse voltages on the main capacitor 32, which could otherwise be caused by stray resonances or the like.

The triggering circuit 40 is arranged to open the switch 10 after a time sufficient for both capacitors 32 and 13 to have discharged, so that the main capacitor 32 can be charged again. In some cases, the igniter 2A may not fire, for example, because of contamination or a hostile environment, thereby causing the capacitor 13 to retain its charge after a firing cycle. The value of the resistor 14 is chosen to allow any such residual charge on the capacitor 13 to be fully discharged during the time the switch 10 is open before the next firing cycle, so that the full resonant voltage on the supplementary capacitor is repeated for the next firing cycle. In this way, all the energy stored in the main capacitor 32 at the start is available for dissipation at the igniter, although its distribution varies during the cycle. The resistance connected across the capacitor could instead be provided by a positive temperature coefficient thermistor. This would have the advantage that, if the switch 10 should fail in a closed state so that a high voltage was applied for a prolonged period across the supplementary capacitor, the power dissipated in the resistance would reduce as it heated, thereby making it self limiting.

It will be appreciated that different forms of switching device could be used, instead of a thyristor.

The present invention enables the voltage rating of the switching device 10 to be less than that required to produce breakdown at the igniter, and may be as low as approximately half this voltage. The inductor 12 provides a definable and controlled rate of change of current through the switching device 10, thus permitting reliable operation regardless of the type or condition of the igniter.

What I claim is:

1. An ignition system comprising: a first capacitor; a voltage source connected across said first capacitor; a series connection of an inductance and a second capacitor, said series connection being connected across said first capacitor and across an ignition output, and a switch connected between said first capacitor and said series connection, so that when said switch is closed, energy stored in said first capacitor is transferred to said series connection, the inductance initially producing a short duration high voltage across said output, said second capacitor charging via the inductance and producing a subsequent longer duration voltage across said output.

2. An ignition system according to claim 1 including a unidirectional device connected across said first capacitor in a reversed biased sense.

3. An ignition system according to claim 1, wherein said switch is a solid-state switch.

4. An ignition system according to claim 3, wherein said switch is a thyristor.

5. An ignition system according to claim 1, wherein said second capacitor is connected to one end of said inductance, wherein said ignition output is connected across a series connection of said second capacitor and said inductance, and wherein said first capacitor is connected to a tapping of said inductance between its ends.

6. An ignition system according to claim 1, wherein said series connection includes a unidirectional device.

7. An ignition system according to claim 1 including a resistor connected in parallel across said second capacitor.

8. An ignition system comprising: a first capacitor; a voltage source connected across said first capacitor; a switch; an inductance, said inductance having a first end, a second end and a tapping between said ends; a second capacitor, said second capacitor having one electrode connected with said first end of said inductance; a connection between an opposite electrode of said second capacitor and one electrode of said first capacitor; a connection of an opposite electrode of said first capacitor to said tapping of said inductance via said switch; and an ignition output connected between said opposite electrode of said second capacitor and said second end of said inductance.

* * * * *